United States Patent
Bao

(10) Patent No.: US 12,068,387 B2
(45) Date of Patent: Aug. 20, 2024

(54) MULTIPLE THRESHOLD VOLTAGE SCHEME IN COMPLEMENTARY METAL OXIDE SEMICONDUCTOR TRANSISTORS

(71) Applicant: International Business Machines Corporation, Armonk, NY (US)

(72) Inventor: Ruqiang Bao, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 26 days.

(21) Appl. No.: 17/505,583

(22) Filed: Oct. 19, 2021

(65) Prior Publication Data

US 2023/0122175 A1     Apr. 20, 2023

(51) Int. Cl.
H01L 21/027      (2006.01)
H01L 29/49       (2006.01)
H01L 29/78       (2006.01)

(52) U.S. Cl.
CPC ...... H01L 29/4966 (2013.01); H01L 21/0274 (2013.01); H01L 29/4908 (2013.01); H01L 29/785 (2013.01)

(58) Field of Classification Search
CPC ............. H01L 21/0274; H01L 29/4908; H01L 29/785; H01L 21/823821; H01L 27/0924; H01L 21/82345; H01L 21/823842; H01L 29/4925–4941; H01L 29/66484; H01L 29/7831–7832; H01L 29/435; H01L 29/495–4958; H01L 29/4966–4975; H01L 21/28061; H01L 21/28079–28088; H01L 21/32051–32053; H01L 29/66515; H01L 21/28097; H01L 29/7855–7856; H01L 29/66795; H01L 29/42312–42396; H01L 29/49–518
See application file for complete search history.

(56) References Cited

U.S. PATENT DOCUMENTS

| | | | |
|---|---|---|---|
| 9,455,201 B2 | 9/2016 | Joshi | |
| 9,502,416 B1 | 11/2016 | Kim | |
| 10,008,494 B2 | 6/2018 | Lai | |
| 10,109,534 B2 | 10/2018 | Brand | |
| 10,170,373 B2 | 1/2019 | Kannan | |
| 10,276,575 B2 | 4/2019 | Walke | |
| 10,497,625 B2 | 12/2019 | Xu | |
| 10,529,817 B2 | 1/2020 | Song | |
| 10,770,353 B2 | 9/2020 | Wang | |
| 2013/0049134 A1 | 2/2013 | Sunamura | |
| 2016/0351569 A1 | 12/2016 | Song | |
| 2019/0371903 A1 | 12/2019 | Bao | |
| 2020/0127089 A1* | 4/2020 | Hsu | H01L 29/66575 |
| 2021/0074593 A1* | 3/2021 | Savant | H01L 21/823842 |

FOREIGN PATENT DOCUMENTS

CN   104425384 B   8/2017

* cited by examiner

*Primary Examiner* — Cuong B Nguyen
(74) *Attorney, Agent, or Firm* — Samuel Waldbaum; Otterstedt & Kammer PLLC

(57) ABSTRACT

A semiconductor structure includes a common semiconductor substrate; a first field effect transistor (FET) gate formed on the substrate, which has a first threshold voltage and comprises a first work function metal and a first barrier layer, and a second FET gate formed on the substrate, which has a second threshold voltage and comprises the first work function metal, the first barrier layer, and a second work function metal.

10 Claims, 19 Drawing Sheets

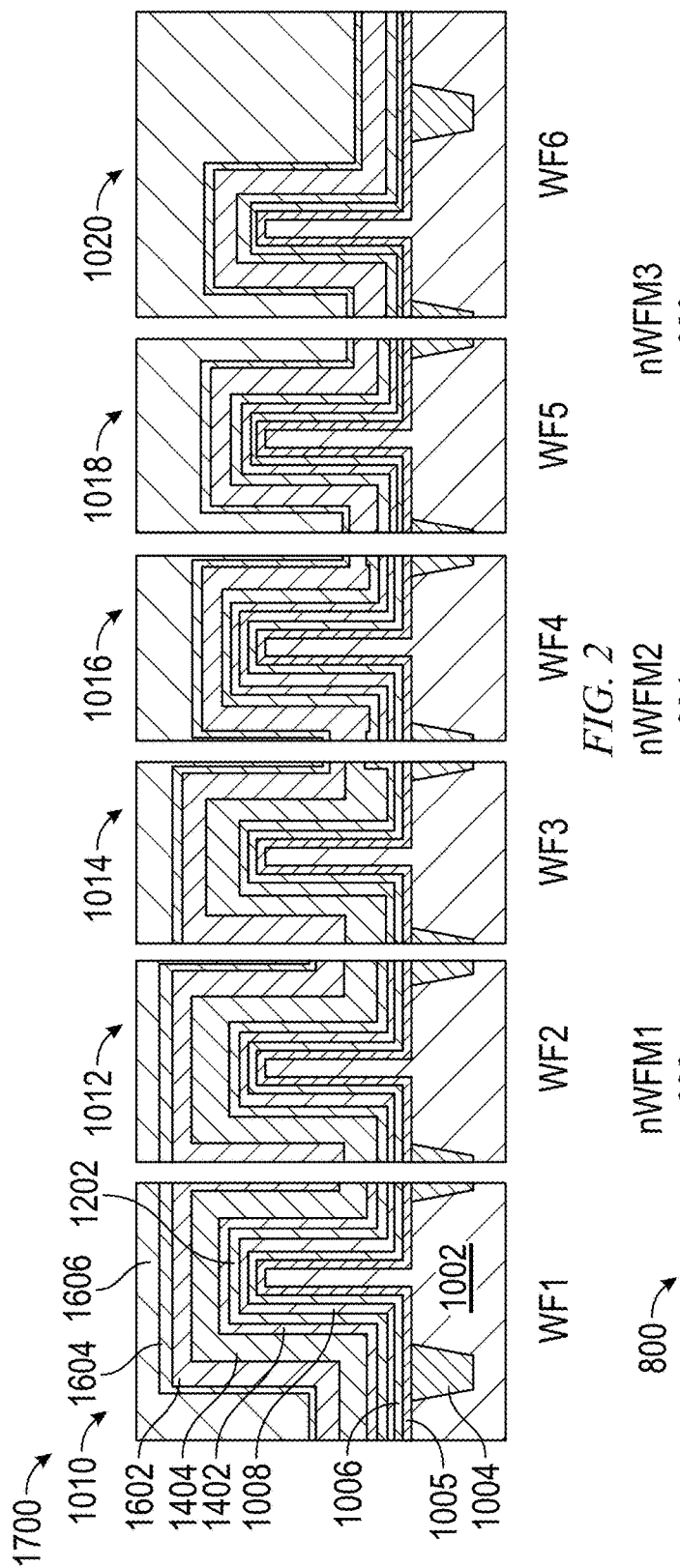

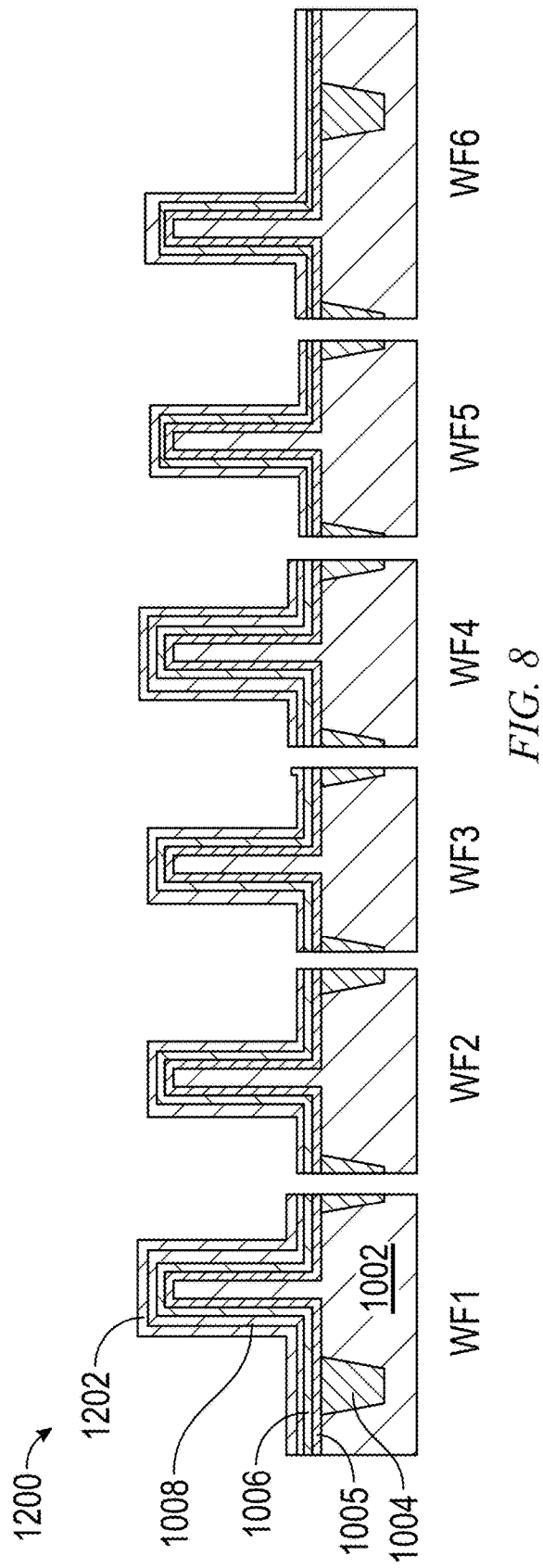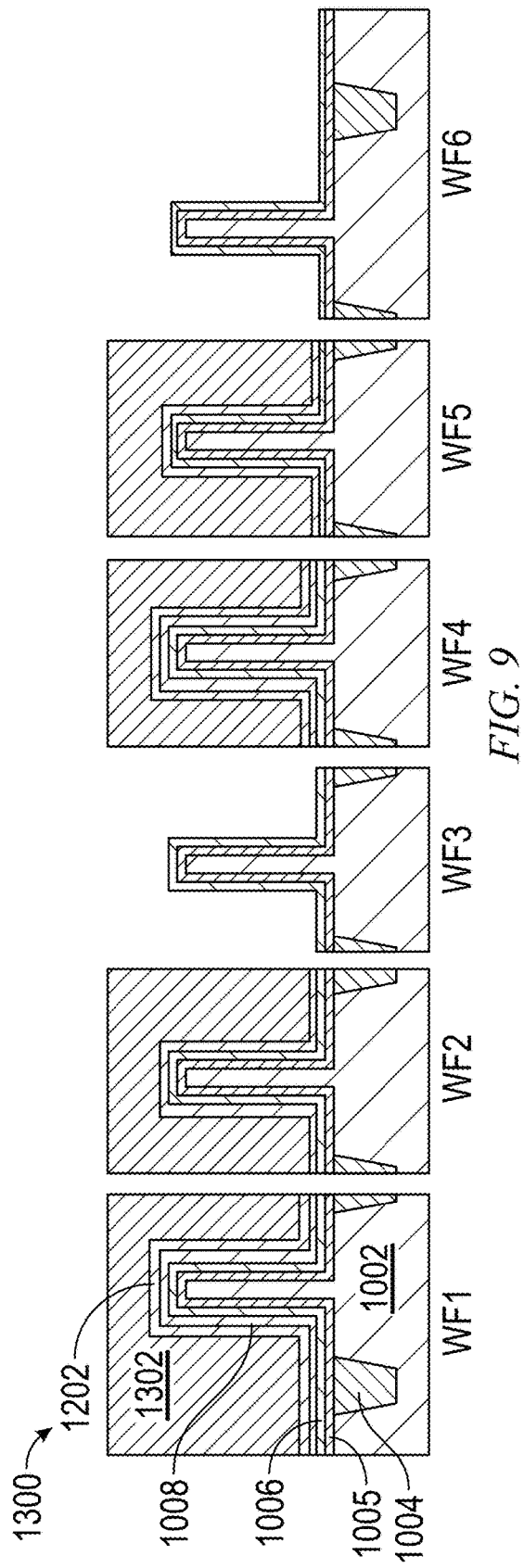

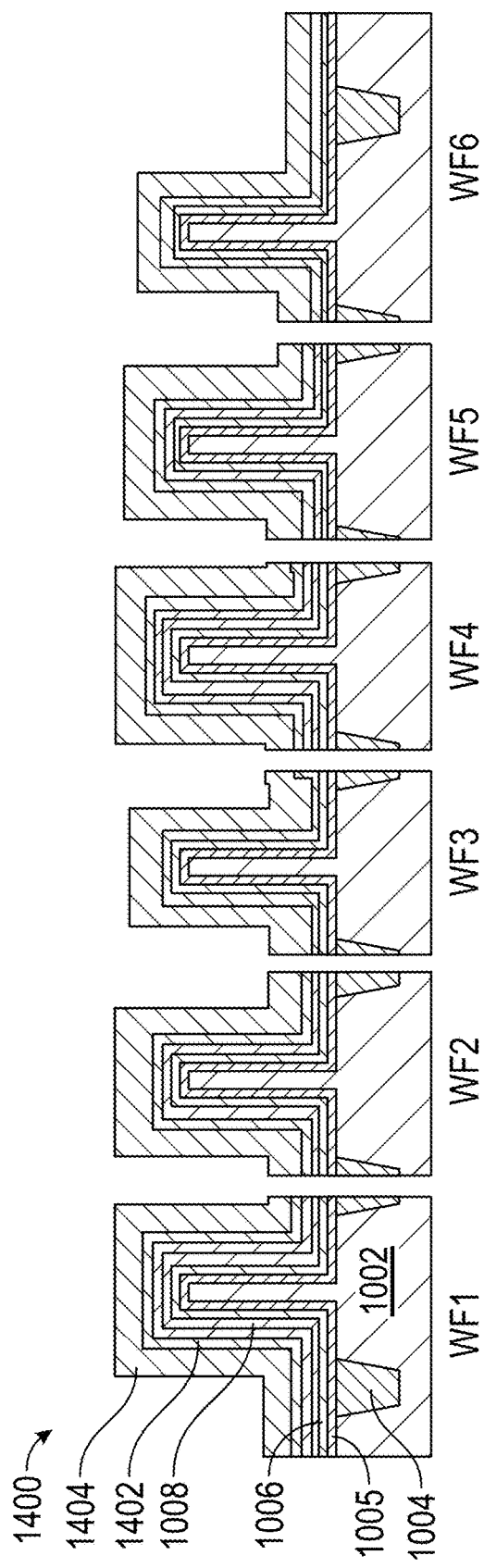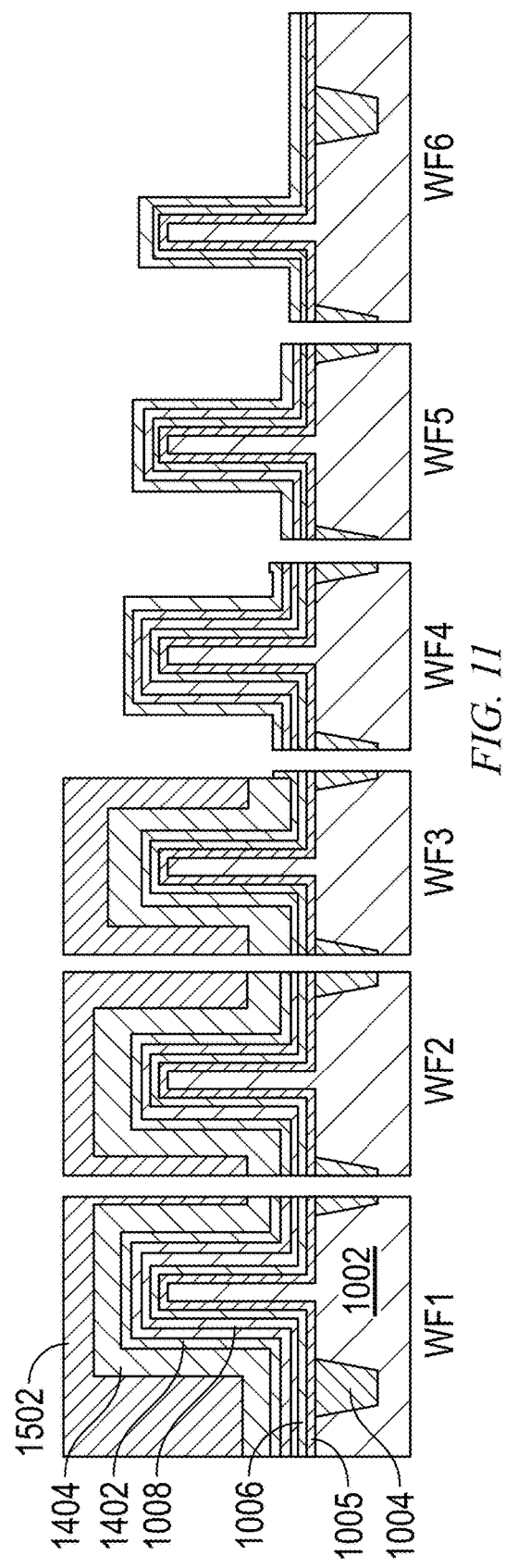

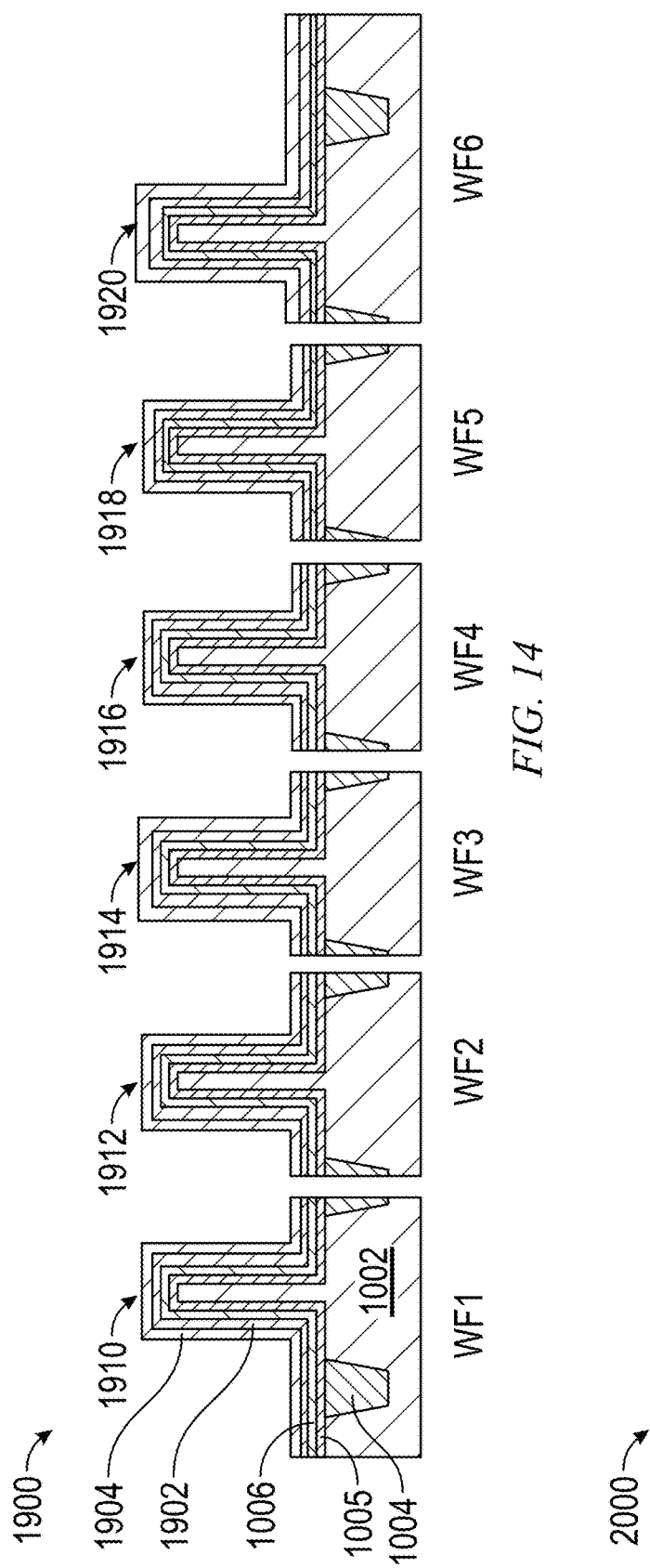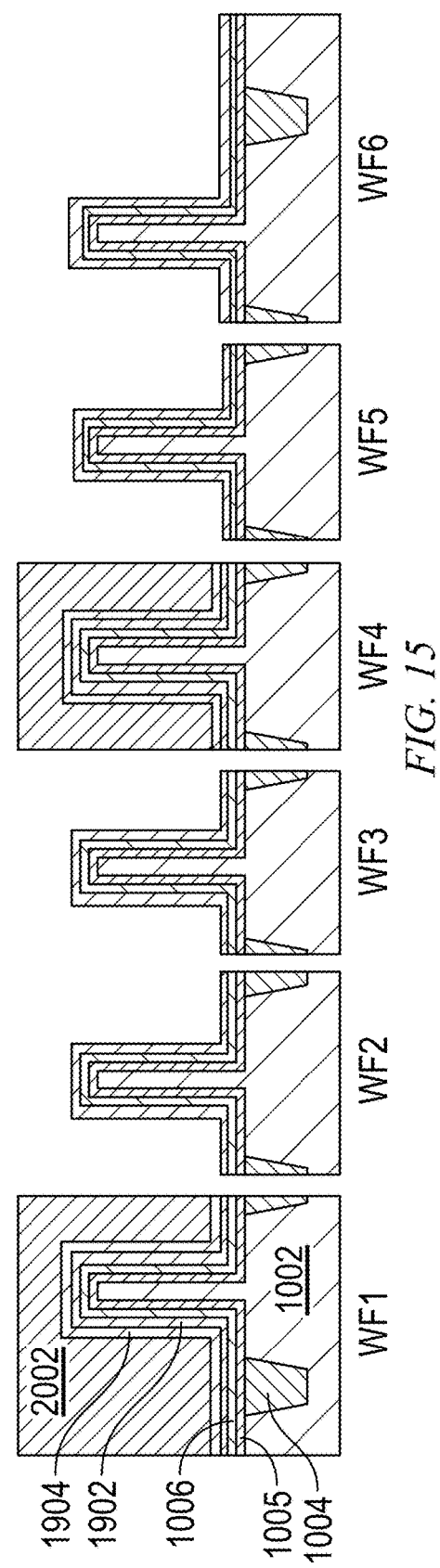

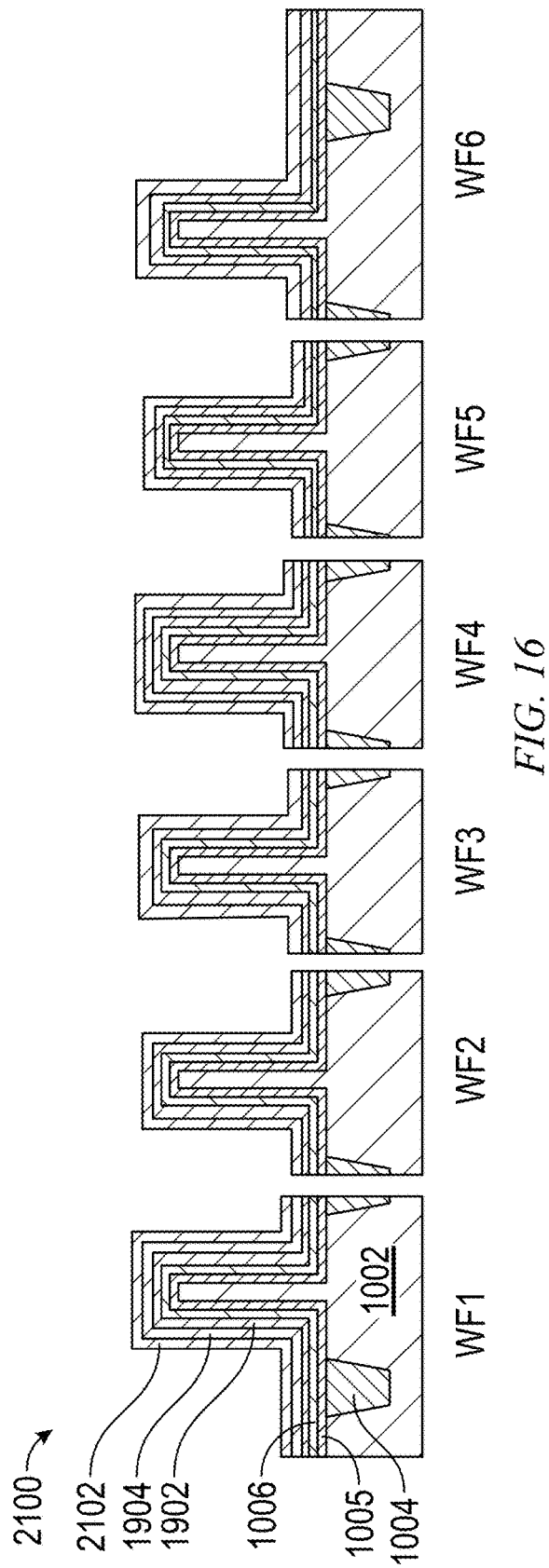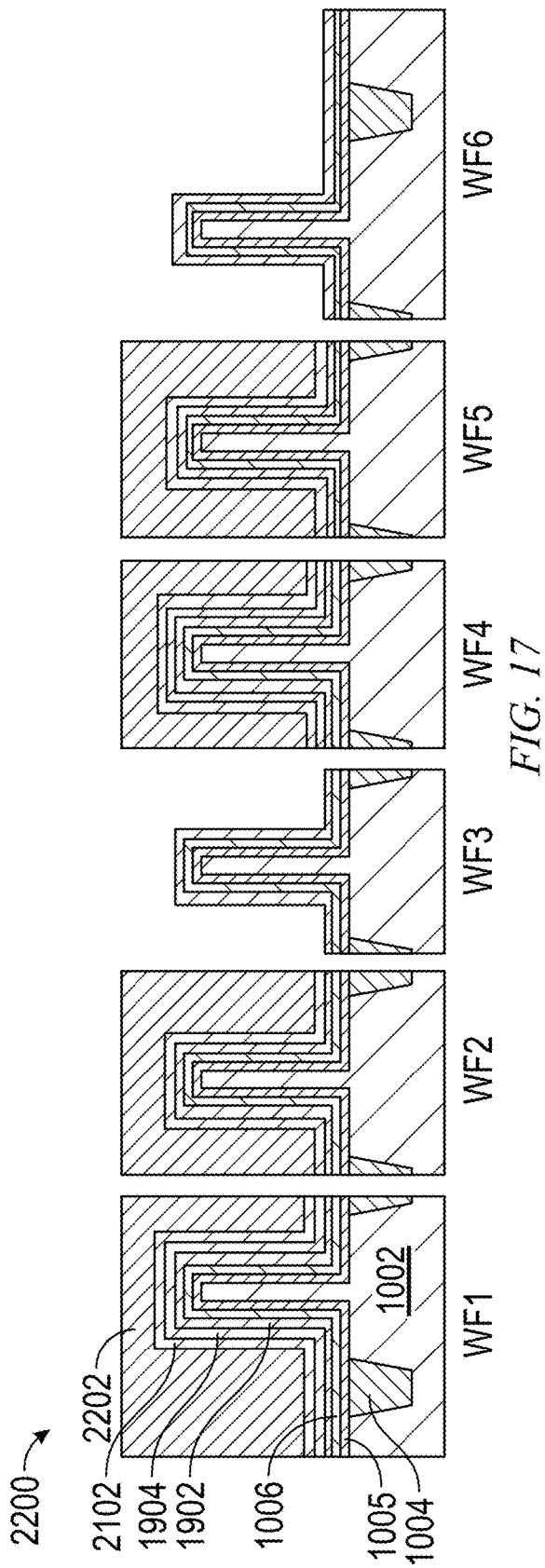

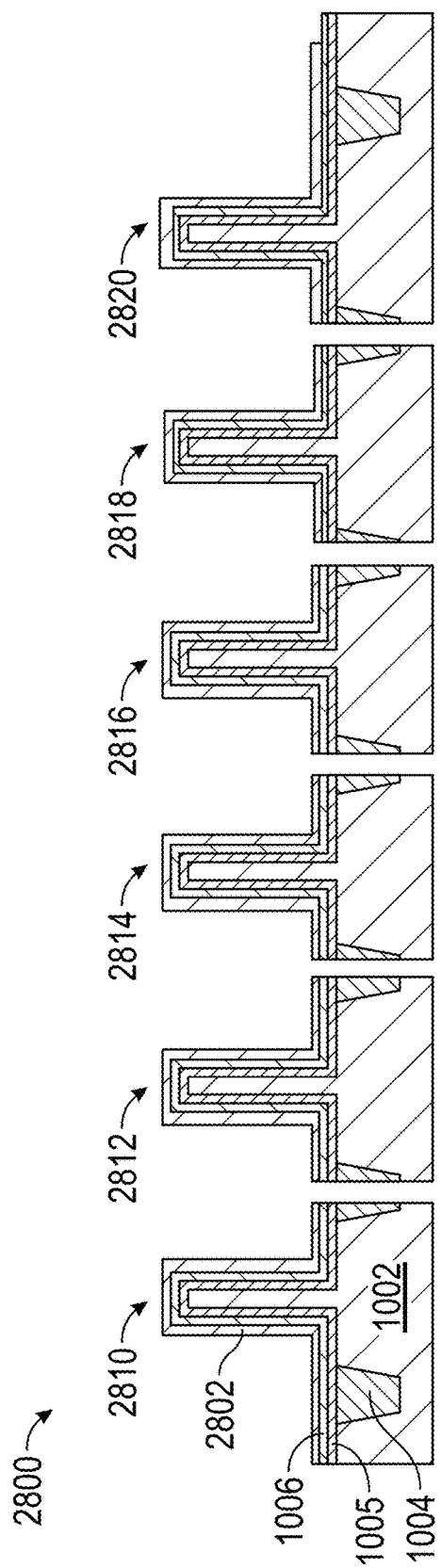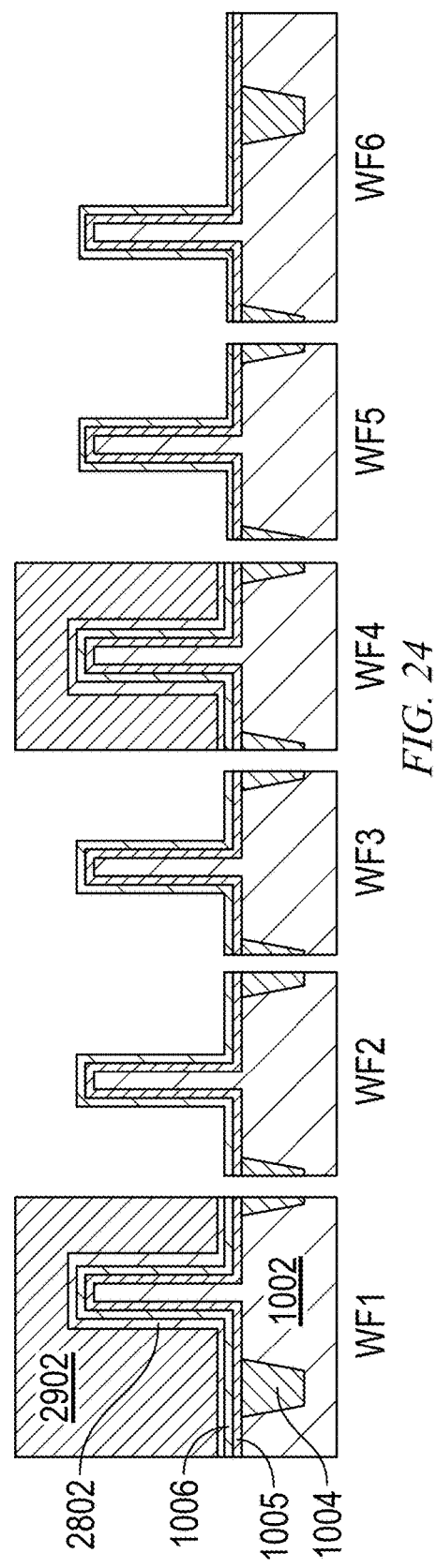

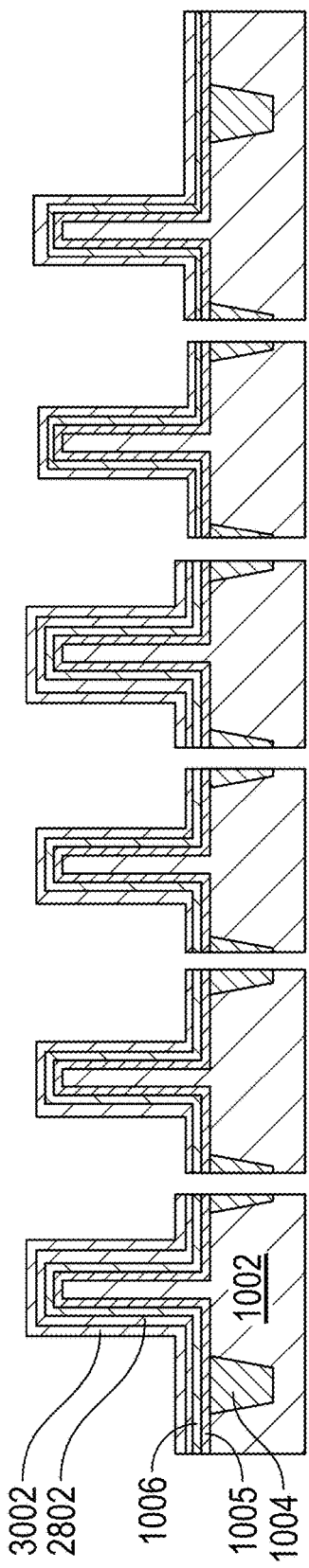
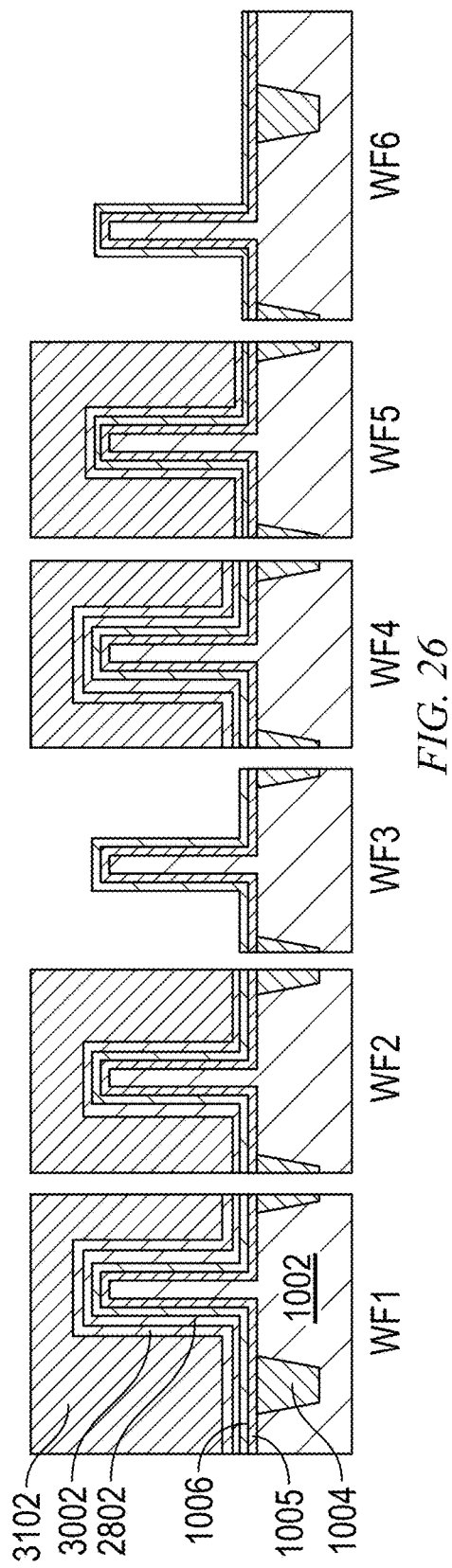

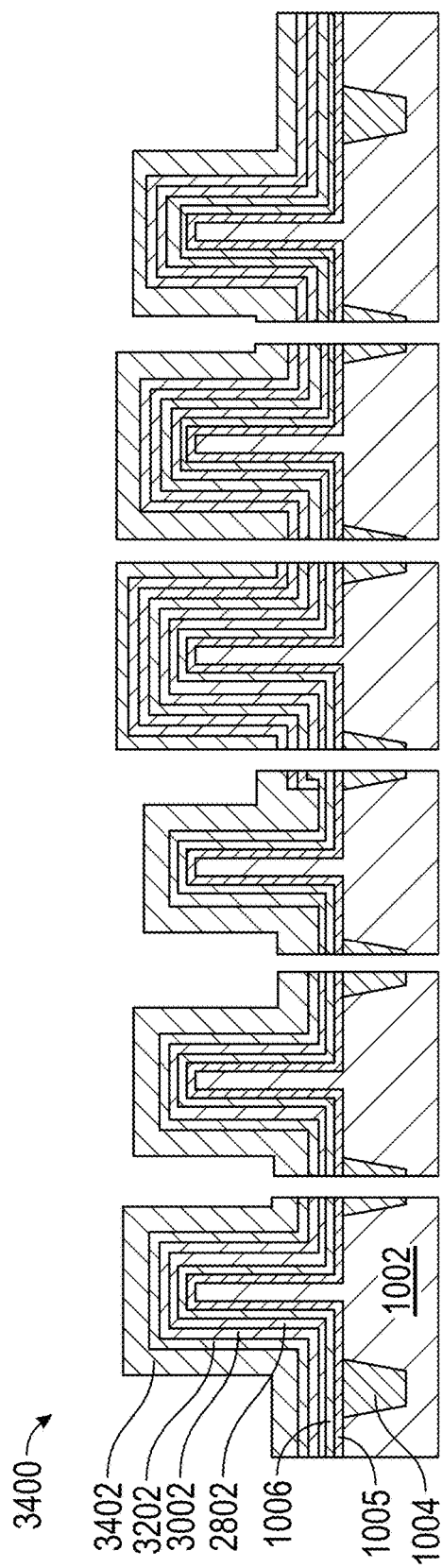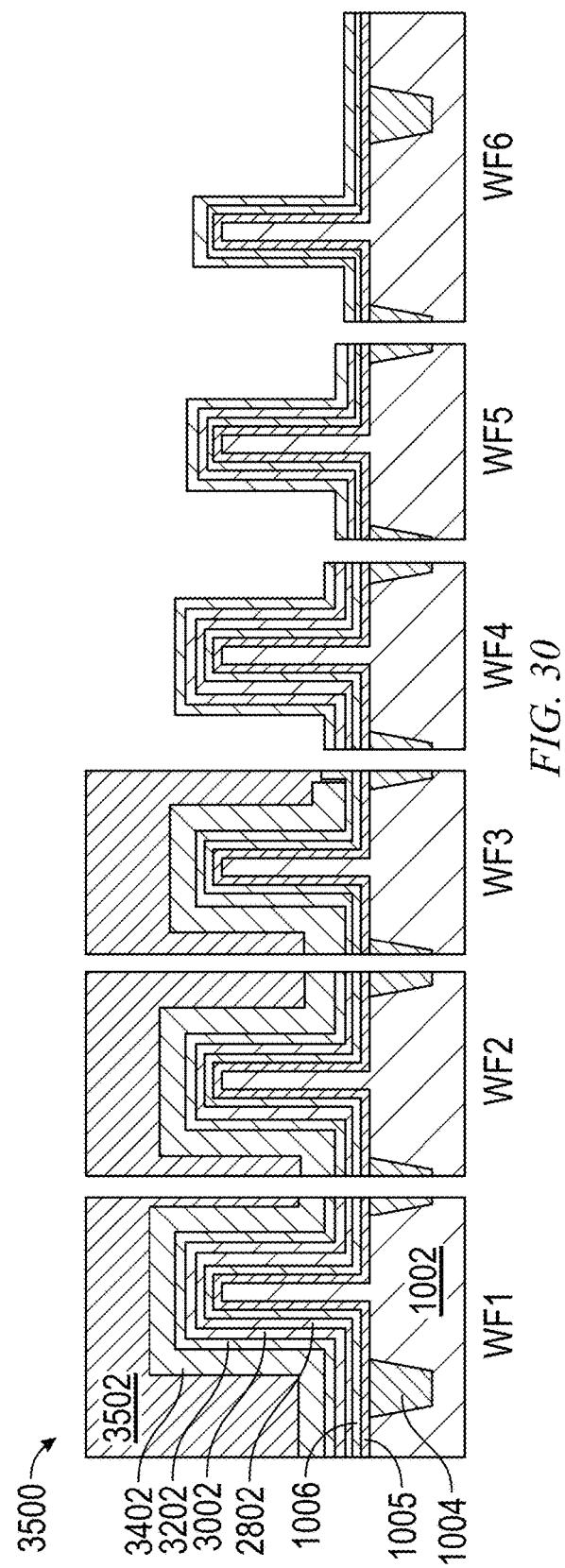

MULTIPLE THRESHOLD VOLTAGE SCHEME IN COMPLEMENTARY METAL OXIDE SEMICONDUCTOR TRANSISTORS

BACKGROUND

The present invention relates to the electrical, electronic, and computer arts, and more specifically, to complementary metal oxide semiconductor (CMOS) transistors.

Threshold voltage is an important characteristic of a CMOS transistor. It helps to determine the power efficiency of any circuit that includes the transistor. Threshold voltage (Vt) of a Field Effect Transistor (FET) is the minimum gate-to-source voltage that is needed to create a conducting path between the source and drain terminals. Threshold voltage can be tuned by controlling the material composition of a transistor, for example, by adjusting the compositions of a barrier layer and of a work function metal layer.

SUMMARY

Principles of the invention provide techniques for a multiple threshold voltage scheme in complementary metal oxide semiconductor transistors. In one aspect, an exemplary semiconductor structure includes a semiconductor substrate and a first field effect transistor (FET) gate formed on the substrate. The first FET gate includes an interfacial layer; a high-κ dielectric layer; a first barrier layer; a first work function metal stack on the first barrier layer; and a second work function metal stack on the first work function metal stack.

According to another aspect, a semiconductor structure includes a common semiconductor substrate; a first field effect transistor (FET) gate formed on the substrate, which has a first threshold voltage and comprises a first work function metal and a first barrier layer; and a second FET gate formed on the substrate, which has a second threshold voltage and comprises the first work function metal, the first barrier layer, and a second work function metal.

Another aspect provides one or more of several methods for making, on a common substrate, a plurality of field effect transistor (FET) gates that have different threshold voltages. The method includes producing a structure that comprises a plurality of regions on the common substrate, wherein each region has one or more barrier layers on the substrate and a first work function metal covering the one or more barrier layers; patterning a photoresist on less than all of the regions and etching the first work function metal from unpatterned ones of the regions; and stripping the photoresist and depositing a second work function metal over a first of the regions that is covered by the first work function metal and over a second of the regions that is not covered by the first work function metal.

In view of the foregoing, techniques of the present invention can provide substantial beneficial technical effects. For example, one or more embodiments provide one or more of:

Modulation of threshold voltages in adjacent devices on a common substrate, using a reduced number of fabrication process steps.

Provision of a number of different threshold voltages as a multiple greater than one of a number of different barrier layer thicknesses.

Provision of a number of different threshold voltages as a multiple greater than one of a number of barrier layers and a number of work function metals.

Adding one more work function metal (requiring only one more patterning) can double the number of threshold voltages compared to a single work function metal.

Embodiments are possible where there is no shared gate for two n-type work function metals, so there is no patterning boundary; the patterning boundary will be between device Vt pairs, which can be designed larger due to other considerations such as dummy gate(s). Thus, there is not any area penalty for this scheme.

Some embodiments may not have these potential advantages and these potential advantages are not necessarily required of all embodiments. These and other features and advantages of the present invention will become apparent from the following detailed description of illustrative embodiments thereof, which is to be read in connection with the accompanying drawings.

BRIEF DESCRIPTION OF THE DRAWINGS

FIG. 2 depicts a schematic of a structure for a FET, seen along view line Y-Y of FIG. 1, according to an exemplary embodiment.

FIG. 3 depicts a semiconductor structure with a plurality of areas covered by a plurality of work function metals, with each area having a plurality of different NMOS and PMOS devices with different threshold voltages.

FIGS. 6-12 depict intermediate structures formed by steps of the process shown in FIG. 5.

FIGS. 14-21 depict intermediate structures formed by steps of the process shown in FIG. 13.

FIGS. 23-30 depict intermediate structures formed by steps of the process shown in FIG. 22.

DETAILED DESCRIPTION

Figure 1:
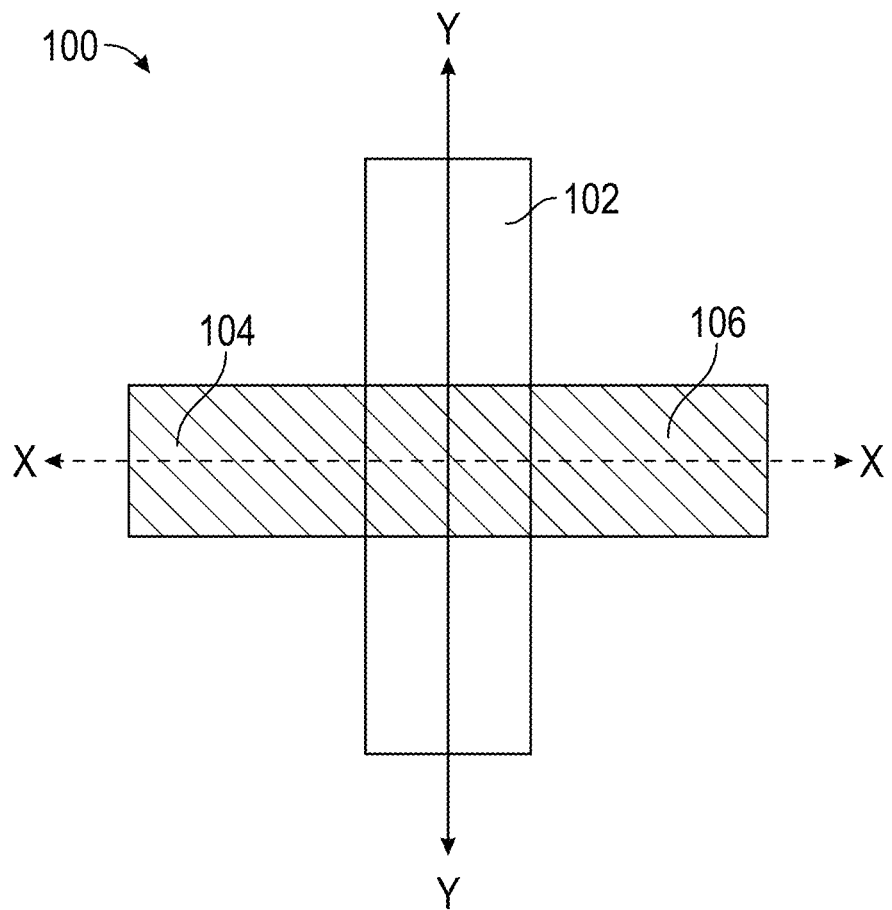
FIG. 1 depicts a top-down schematic of a field effect transistor (FET).

FIG. 1 depicts a field effect transistor (FET) 100 that includes a gate 102, a source 104, and a drain 106. View lines X-X and Y-Y are shown.

FIG. 2 depicts a structure for a FET 1700, according to an exemplary embodiment. The FET 1700 includes a high-k dielectric (HK) 1006 (in one or more embodiments, hafnium oxide (HfO), zirconium oxide (ZrO), or titanium oxide (TiO) with k on the order of 3-15 times higher than silicon dioxide ($SiO_2$), e.g., on the order of 10-50, or similar suitable materials) and a first barrier layer 1008 (in one or more embodiments, titanium nitride, although other materials such as tantalum nitride, indium oxide, copper silicide, tungsten nitride also could be suitable) on a substrate 1002 with shallow trench isolation (STI) 1004. The STI 1004 separates the structure 1000 into regions 1010, 1012, 1014, 1016, 1018, 1020, all of which have different work functions. The FET 1700 also includes a second barrier layer 1202, a third barrier layer 1402 and a first work function metal 1404, a second work function metal 1602, a wetting layer 1604 such as TiN, and an electrode 1606.

Work function metal (WFM) layers are disposed over the gate dielectric layer in both the nFET and pFET regions (in embodiments having both types of regions) to complete the gate stacks. Non-limiting examples of suitable work function (gate) metals include p-type work function metal materials and n-type work function metal materials. P-type work function materials include compositions such as ruthenium, palladium, platinum, cobalt, nickel, and conductive metal nitrides like TiN, WN, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof.

The work function metal(s) may be deposited by a suitable deposition process, for example, atomic layer deposition (ALD), chemical vapor deposition (CVD), plasma enhanced CVD (PECVD), physical vapor deposition (PVD), plating, and thermal or e-beam evaporation. Pinch-off of work function metal material between semiconductor fins is essentially avoided during deposition. The WFM layer is removed from one of the nFET and pFET regions in structures including both types of regions while the other region is protected. An SC1 etch, an SC2 etch or other suitable etch processes can be employed to remove the selected portion of the originally deposited WFM layer. A new WFM layer suitable for the region is then deposited. A device formed in the nFET region will accordingly include a WFM layer (gate electrode) having a first composition while a device in the pFET region will have a WFM layer having a second composition. For example, the WFM employed in an nFET region may be a Ti, Al, TiAl, TiAlC or TiAlC layer or a metal stack such as TiN/TiAl/TIN, TiN/TiAlC/TIN, TiN/TaAlC/TiN, or any combination of an aluminum alloy and TiN layers. The WFM layer employed in the pFET region may, for example, be a TIN, TiC, TaN or a tungsten (W) layer. The threshold voltage (Vt) of nFET devices is sensitive to the thickness of work function metals such as titanium nitride (TiN).

Referring to FIG. 3, an exemplary semiconductor structure 800 has a plurality of areas covered by a plurality of work function metals, with each area having a plurality of different NMOS and PMOS devices with different threshold voltages. The structure 800 includes a first area 802 that is covered by a first work function metal (nWFM1), a second area 804 that is covered by a second work function metal (nWFM2), and a third area 806 that is covered by a third work function metal (nWFM3). Metals nWFM1, nWFM2, and nWFM3 could be, for example, either one material with different thickness, or different materials with the same thickness or different thickness). In another embodiment, metals nWFM1, nWFM2, and nWFM3 are formed by multiple metal layers either with same materials or different materials. The first area 802 includes NMOS devices 810, 812, 814 with threshold voltages nVt1, nVt2, NVt3 and PMOS devices 816, 818, 820 with threshold voltages pVt1, pVt2, pVt3. The threshold voltages on the first area 802 are set by the thickness and electrical properties of the first work function metal nWFM1 in combination with thicknesses and electrical properties of different barrier layers on the different devices 810, 812, 814, 816, 818, 820. The different NMOS devices 810, 812, 814 on area 802 share some of the same bottom layers with NMOS devices 822, 824, 826 (nVt4, pVt5, pVt6) on area 804 and NMOS devices 834, 836, 838 (nVt7, nVt8, nVt9) on area 806. The different PMOS devices 816, 818, 820 on area 802 share some of the same bottom layers with PMOS devices 828, 830, 832 on area 804 (pVt4, pVt5, pVt6) and PMOS devices 840, 842, 844 (pVt7, pVt8, pVt9) on area 806. Here, the different threshold voltages could be associated with different devices such as I/O device, analog devices, and logic devices.

Figure 4:
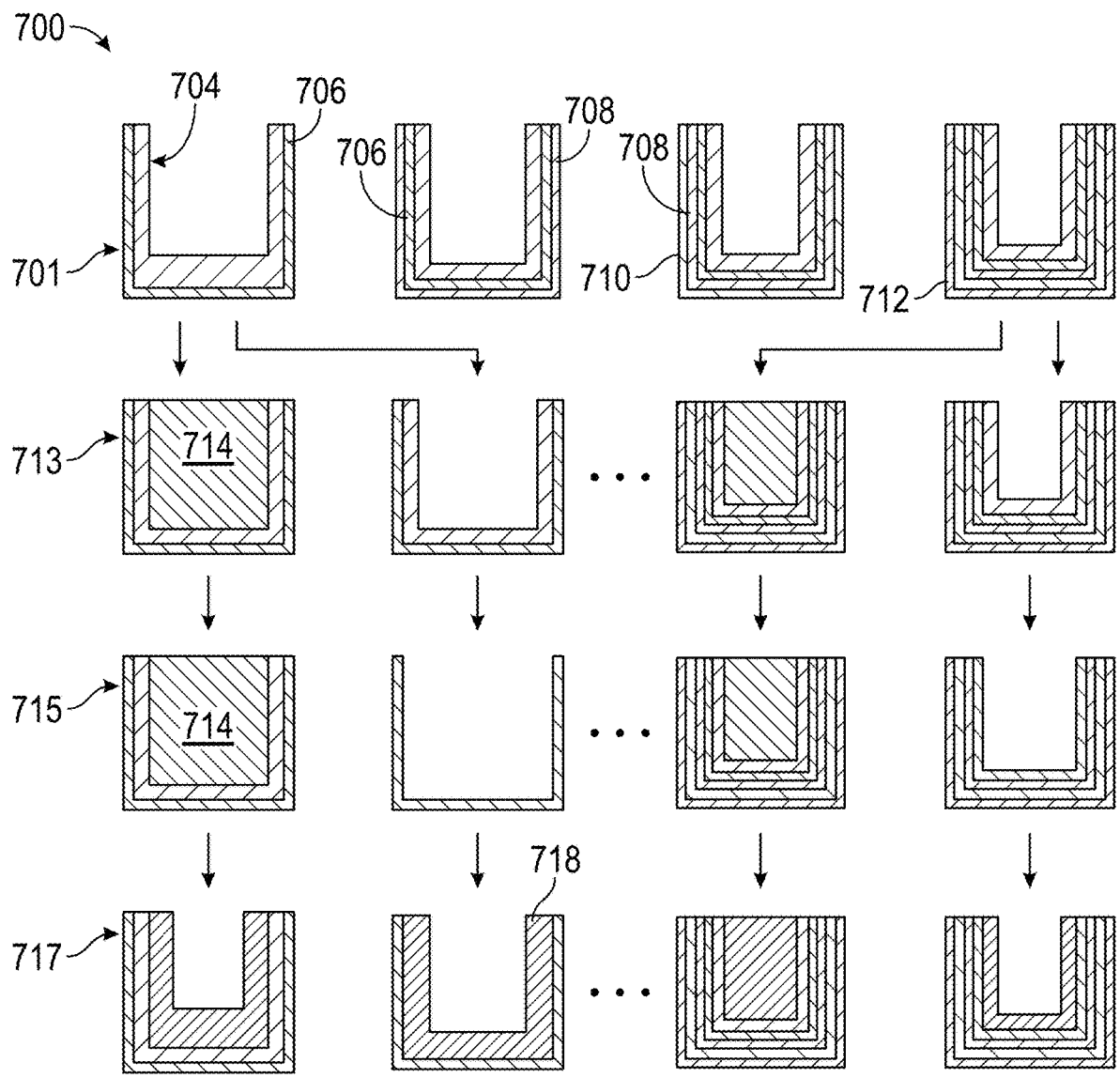
FIG. 4 depicts selected steps of a process for fabricating a structure similar to the structure of FIG. 3.

FIG. 4 depicts selected steps of a process 700 for fabricating a structure similar to the structure of FIG. 3. At 701, deposit a first work function metal 704 on one or more layers of barrier metals 706, 708, 710, 712. At 713, pattern an organic planarization layer 714 onto portions of the work function metal 704. At 715, remove the unpatterned portions of the work function metal 704. At 717, strip the organic planarization layer 714 and deposit a second work function metal 718.

Figure 5:
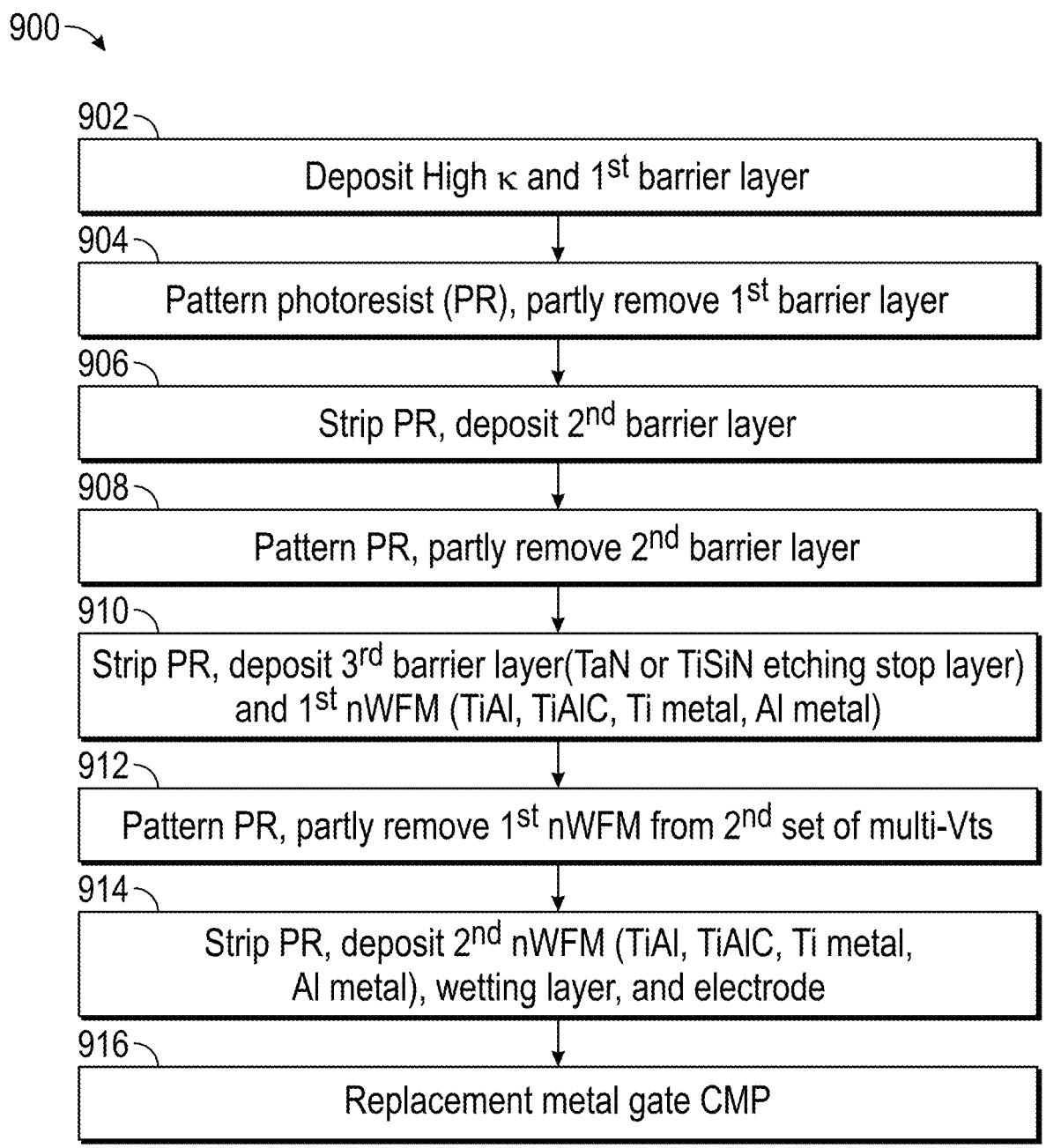
FIG. 5 depicts steps of a process for fabricating the structure of FIG. 2, according to an exemplary embodiment.
Figure 6:
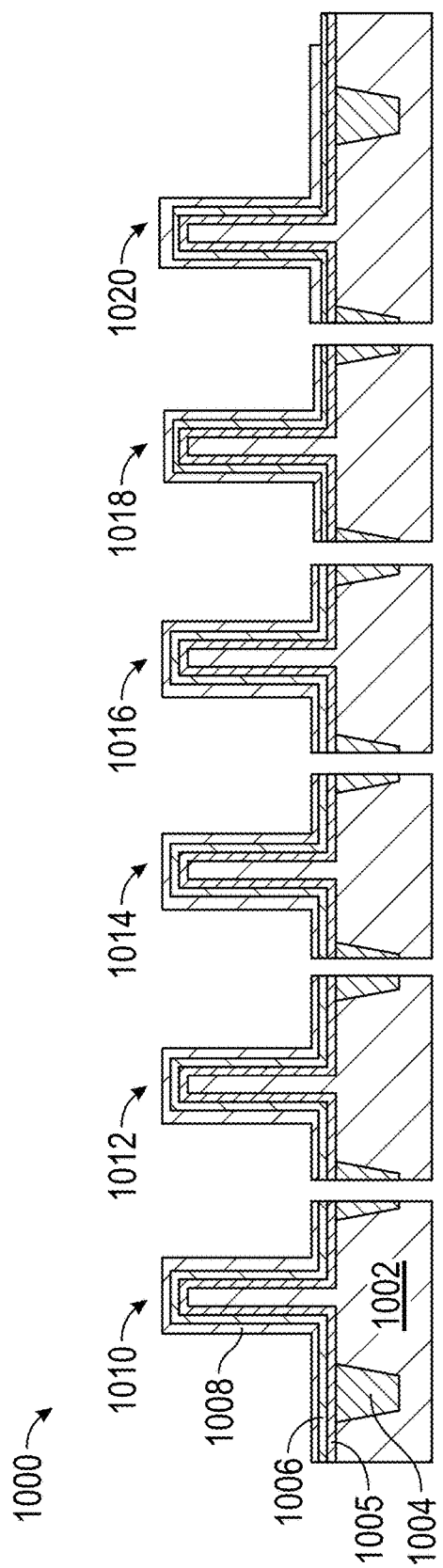
Figure 7:
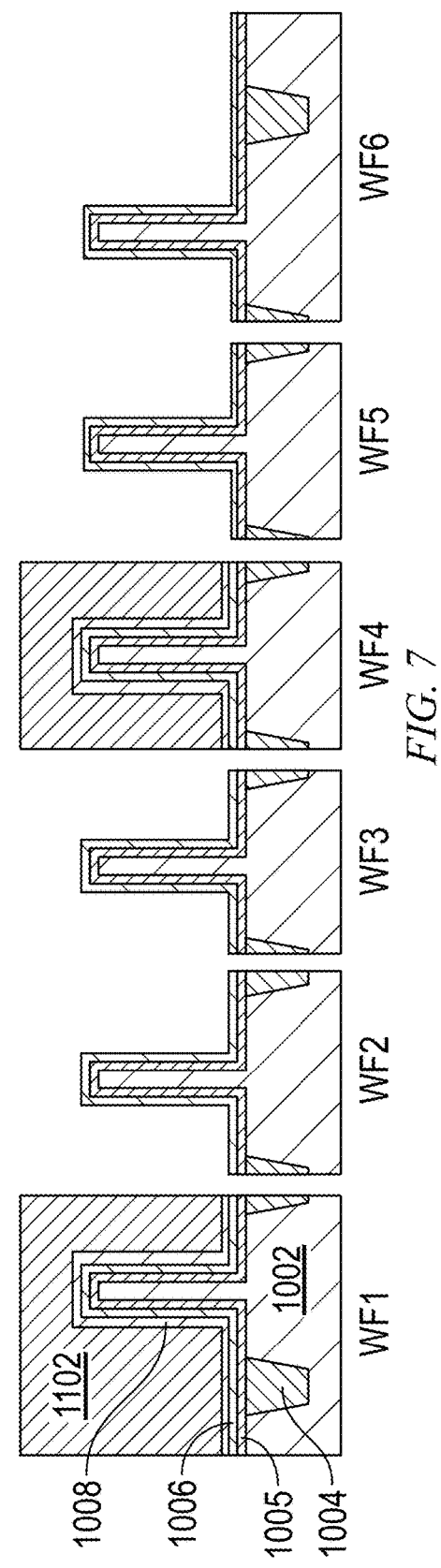

FIG. 5 depicts steps of a first method 900 for forming the structure 1700 (shown in FIG. 2) that is similar to area 802 of structure 800. At 902, produce a first structure 1000 (as shown in FIG. 6) by depositing a high-κ dielectric (HK) 1006 (in one or more embodiments, hafnium oxide (HfO), zirconium oxide (ZrO), or titanium oxide (TiO) with k on the order of 3-15 times higher than silicon dioxide ($SiO_2$), e.g., on the order of 10-50, or similar suitable materials) and a first barrier layer 1008 (in one or more embodiments, titanium nitride, although other materials such as tantalum nitride, indium oxide, copper silicide, tungsten nitride also could be suitable) onto a substrate 1002 with shallow trench isolation (STI) 1004 and an interfacial layer 1005. The STI 1004 separates the structure 1000 into regions 1010, 1012, 1014, 1016, 1018, 1020. At 904, produce a second structure 1100 (as shown in FIG. 7) by patterning regions 1010 and 1016 of the precursor structure 1000 with photoresist 1102 and etching exposed portions of the first barrier layer 1008 from regions 1012, 1014, 1018, 1020. At 906, produce a third structure 1200 (as shown in FIG. 8) by stripping the photoresist 1102 and then depositing a second barrier layer 1202.

Figure 12:
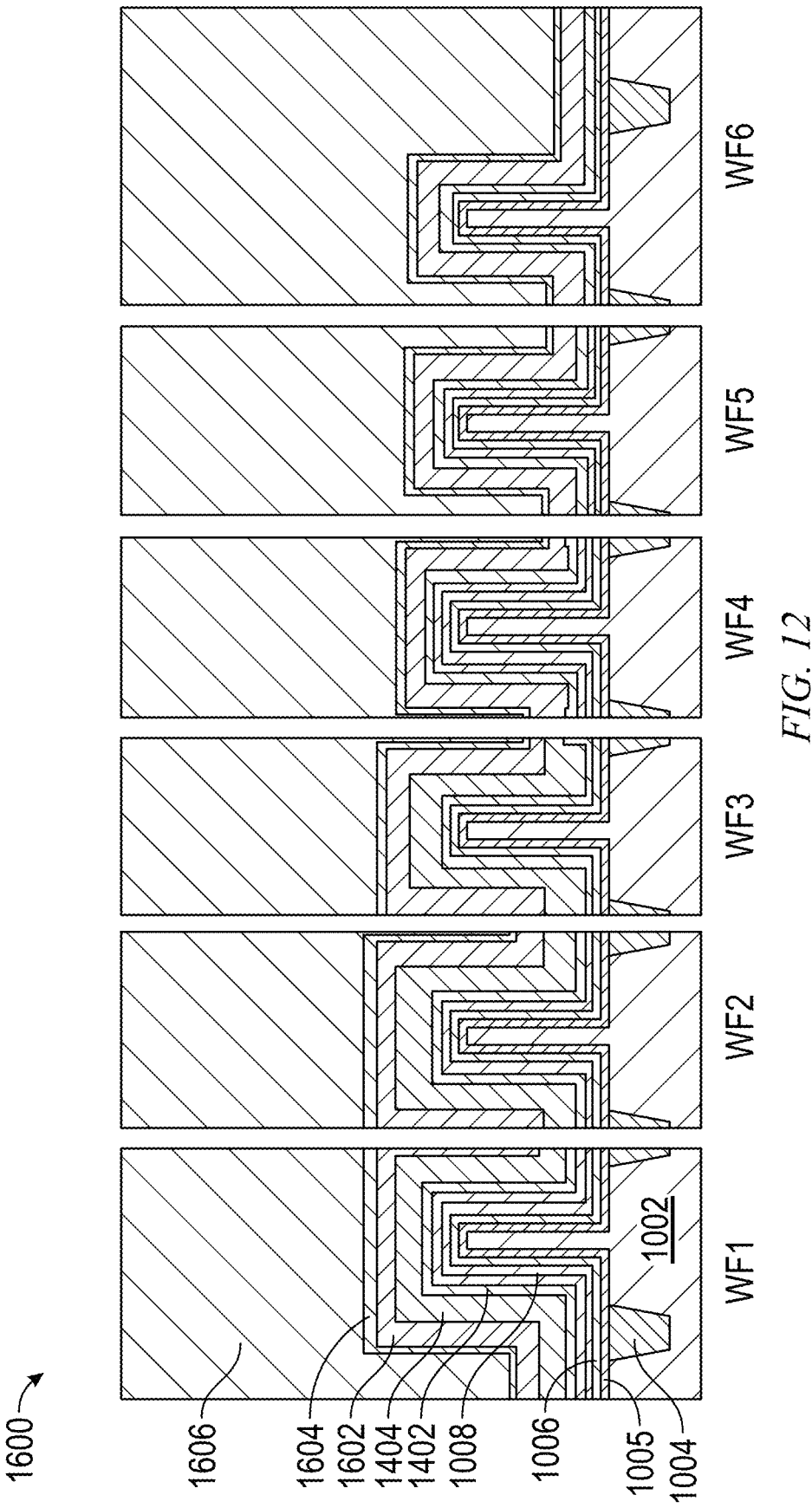

At 908, produce a fourth structure 1300 (as shown in FIG. 9) by patterning regions 1010, 1012, 1016, 1018 of the third structure 1200 with photoresist 1302 and removing exposed portions of the second barrier layer 1202 from regions 1014, 1020. At 910, produce a fifth structure 1400 (as shown in FIG. 10) by stripping the photoresist 1302 and depositing a third barrier layer 1402 and a first work function metal 1404. At 912, produce a sixth structure 1500 (as shown in FIG. 11) by patterning regions 1010, 1012, 1014 of the fifth structure 1400 with a photoresist 1502 and etching exposed portions of the first work function metal 1404 from regions 1016, 1018, 1020. At 914, produce a seventh structure 1600 (as shown in FIG. 12) by stripping the photoresist 1502, then depositing a second work function metal 1602, a wetting layer 1604 such as TiN, and an electrode 1606 (e.g., copper, aluminum, tungsten). At 916, chemical mechanical polish/planarize (CMP) the structure 1600 to produce the structure 1700 of FIG. 2.

Figure 13:
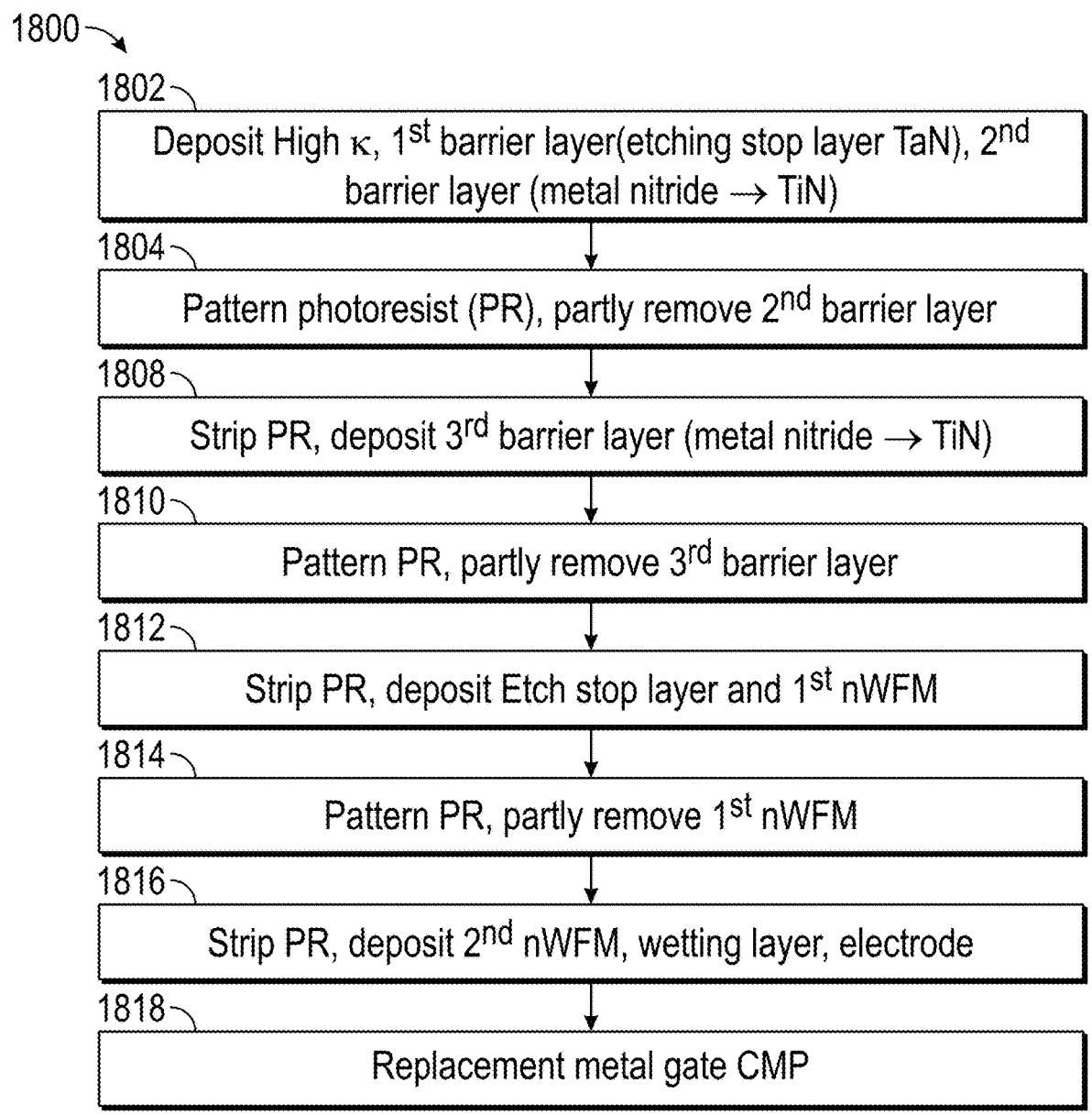
FIG. 13 depicts steps of another process for fabricating the structure of FIG. 2, according to an exemplary embodiment.
Figure 21:
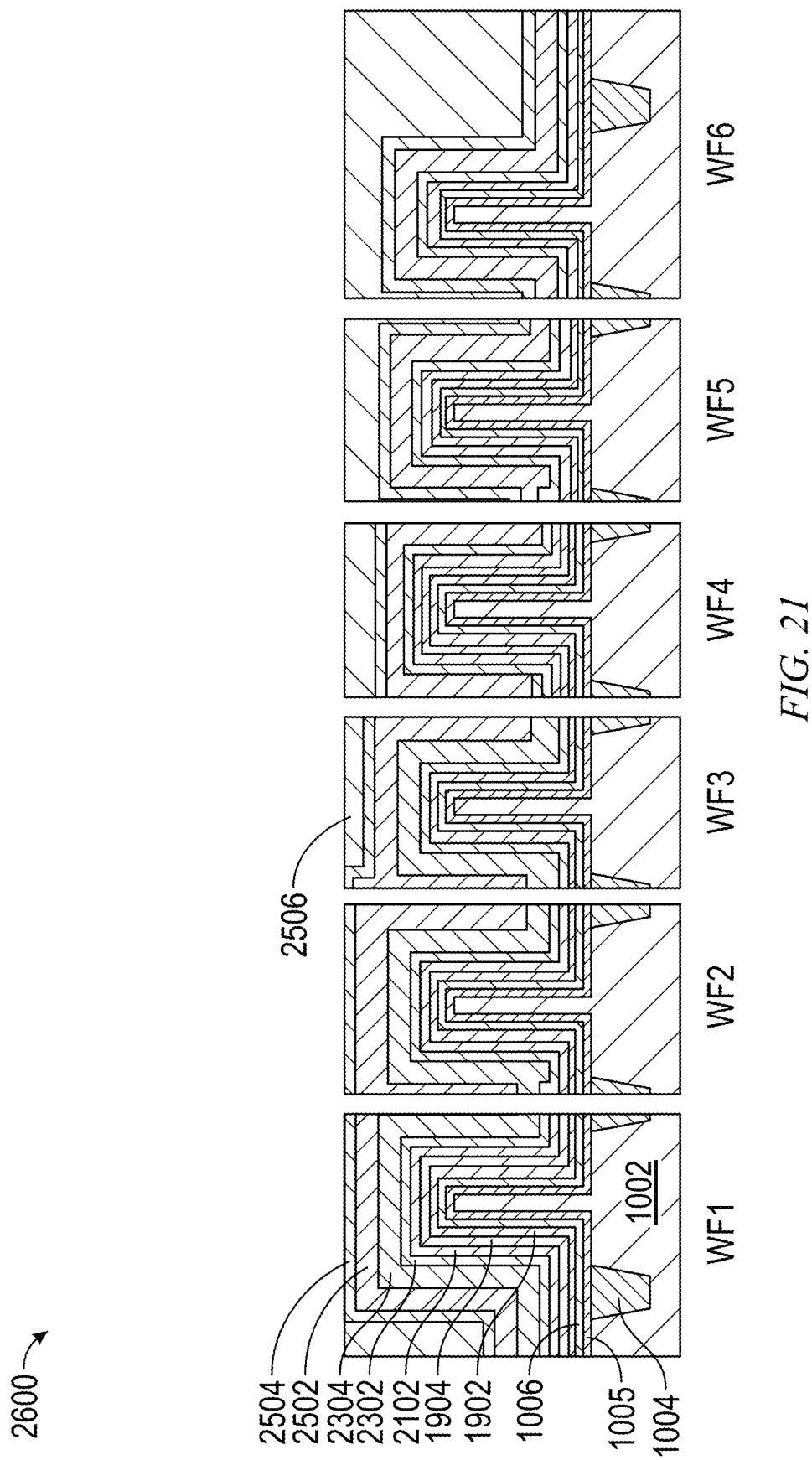

FIG. 13 shows steps of a method 1800 for producing a structure 2600 (as shown in FIG. 21) that is similar to area 802 of the structure 800. At 1802, produce a first structure 1900 (as shown in FIG. 14) by depositing high-κ dielectric 1006, a first barrier layer 1902 (e.g., an etch stop layer of tantalum nitride), and a second barrier layer 1904 (e.g., a metal nitride such as titanium nitride, although any of tantalum nitride, indium oxide, copper silicide, tungsten nitride or other suitable conductive ceramics could be used) onto a substrate 1002 with shallow trench isolation (STI) 1004 and interfacial layer 1005. The STI 1004 divides the structure 1900 into regions 1910, 1912, 1914, 1916, 1918, 1920. At 1804, form a second structure 2000 (as shown in FIG. 15) by patterning a photoresist 2002 on regions 1910 and 1916, then removing the second barrier layer 2002 from regions 1912, 1914, 1918, 1920. At 1808, form a third structure 2100 (as shown in FIG. 16) by stripping the photoresist 2002, then depositing a third barrier layer 2102.

Figures 18, 19:
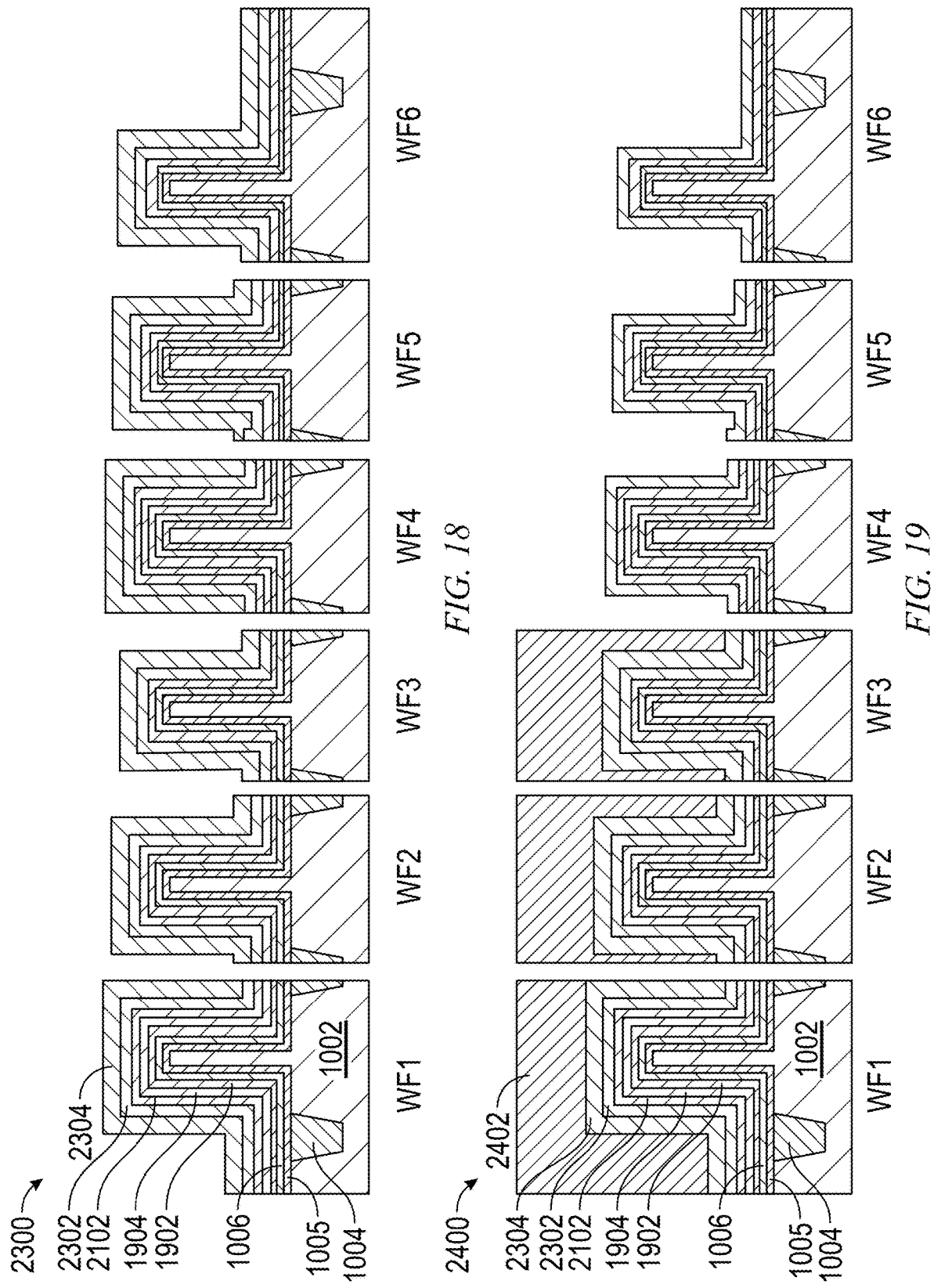
Figure 20:
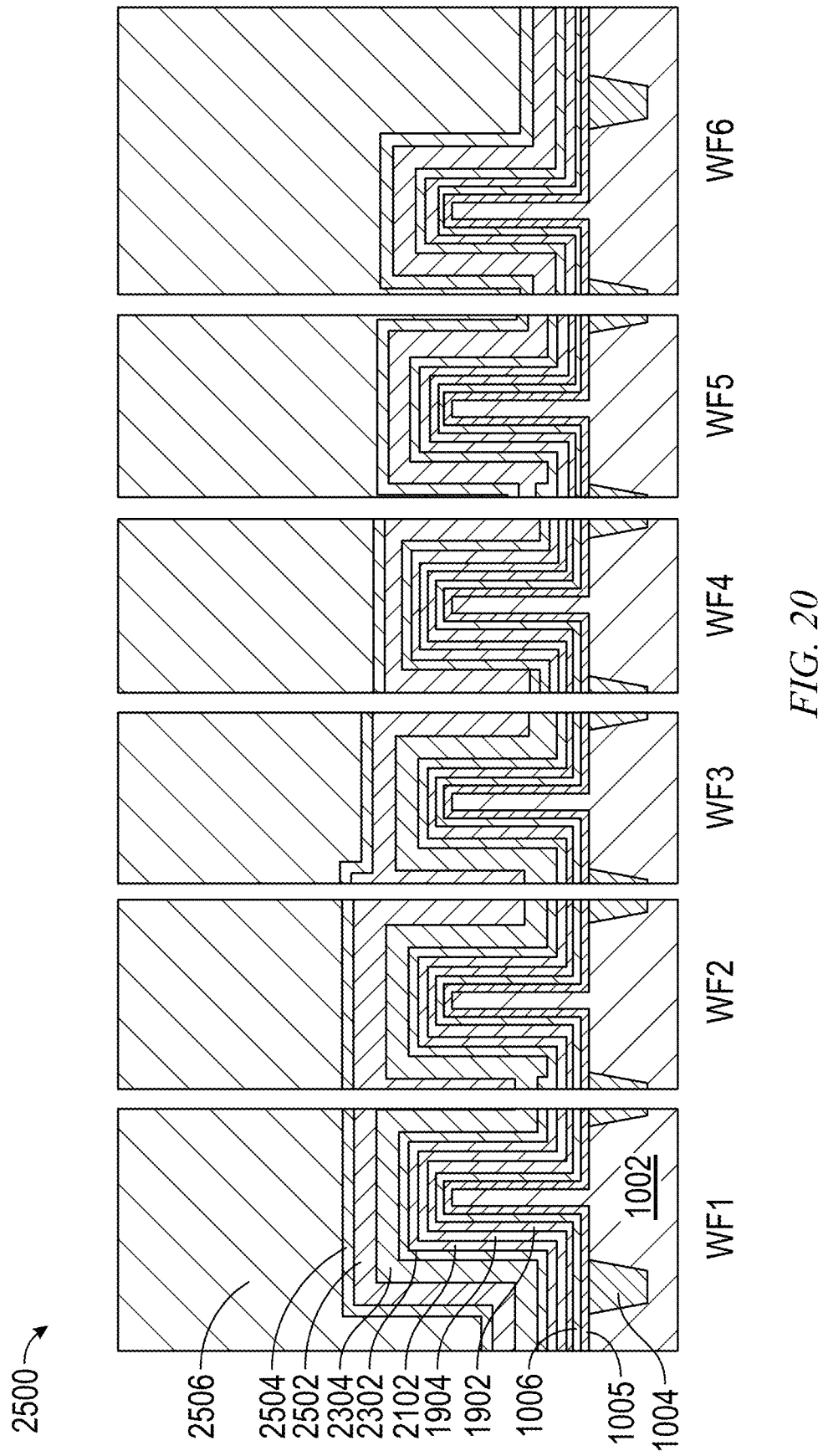

At 1810, form a fourth structure 2200 (as shown in FIG. 17) by patterning a photoresist 2202 on regions 1910, 1912, 1916, 1918 and then removing the third barrier layer 2102 from regions 1914, 1920. At 1812, form a fifth structure 2300 (as shown in FIG. 18) by stripping the photoresist 2202, then depositing an etch stop layer 2302 and a first work function metal 2304. At 1814, form a sixth structure 2400 (as shown in FIG. 19) by patterning a photoresist 2402 over regions 1910, 1912, 1914, then removing the first work function metal 2304 from regions 1916, 1918, 1920. At 1816, form a seventh structure 2500 (as shown in FIG. 20) by stripping the photoresist 2402, then depositing a second work function metal 2502, a wetting layer 2504, and an electrode 2506. At 1818, form the structure 2600 (as shown in FIG. 21) by chemical mechanical polishing (CMP) of the structure 2500.

Figure 22:
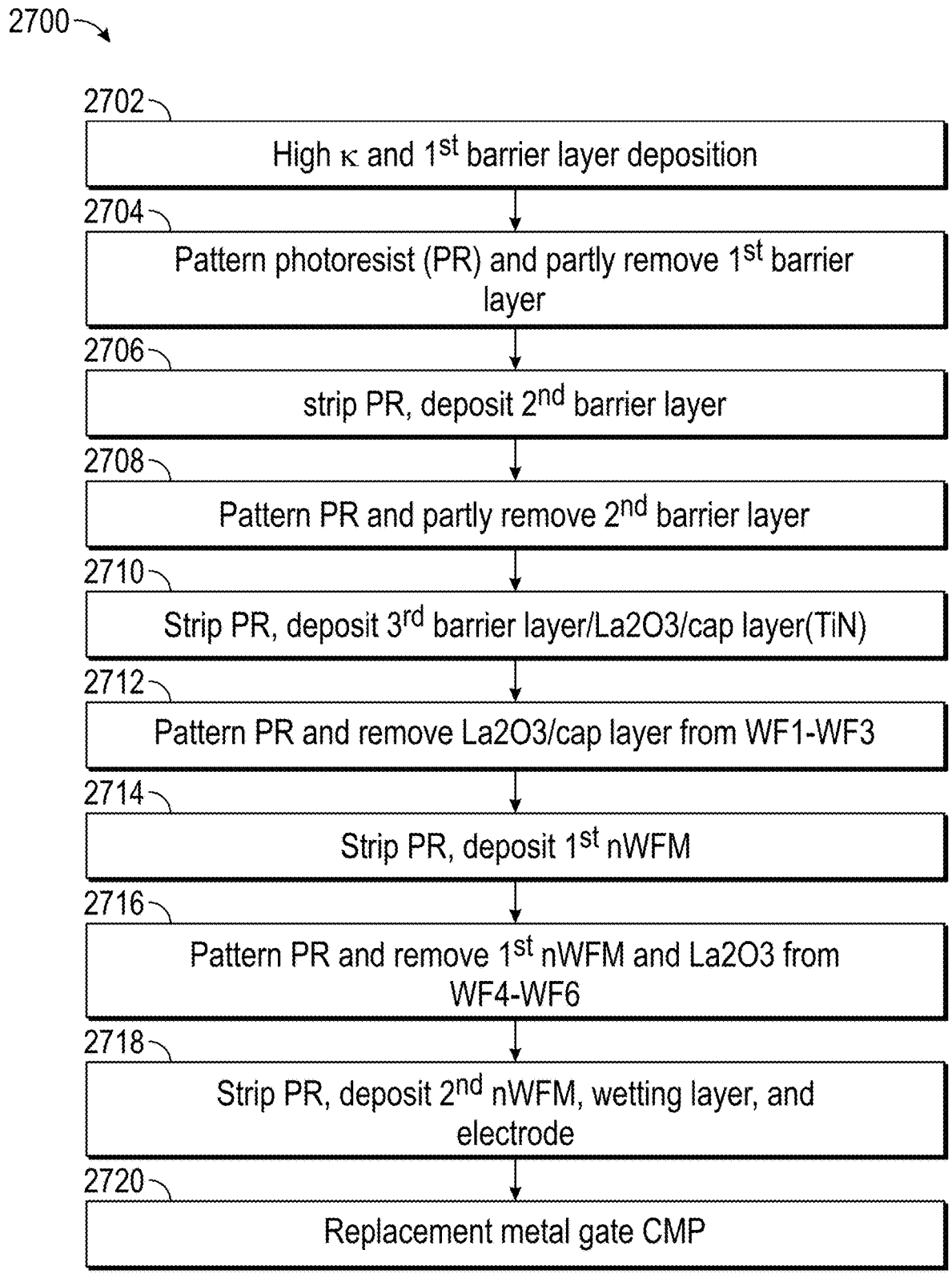
FIG. 22 depicts steps of another process for fabricating the structure of FIG. 2, according to an exemplary embodiment.

FIG. 22 shows steps of another method 2700 for producing the structure 1700 (as shown in FIG. 2). At 2702, form a first structure 2800 (as shown in FIG. 23) by depositing a high-κ dielectric 1006 and a first barrier layer 2802 onto a precursor that includes a substrate 1002 with shallow trench isolation (STI) 1004 and interfacial layer 1005. The first structure 2800 has regions 2810, 2812, 2814, 2816, 2818, 2820 that are defined by the STI 1004. At 2704, form a second structure 2900 (as shown in FIG. 24) by patterning a photoresist 2902 on regions 2810, 2816 and removing the first barrier layer 2802 from regions 2812, 2814, 2818, 2820. At 2706, form a third structure 3000 (as shown in FIG. 25) by stripping the photoresist 2902, then depositing a second barrier layer 3002. At 2708, form a fourth structure 3100 (as shown in FIG. 26) by patterning a photoresist 3102 on regions 2810, 2812, 2816, 2818 and removing the second barrier layer 3002 from regions 2814, 2820.

Figure 27:
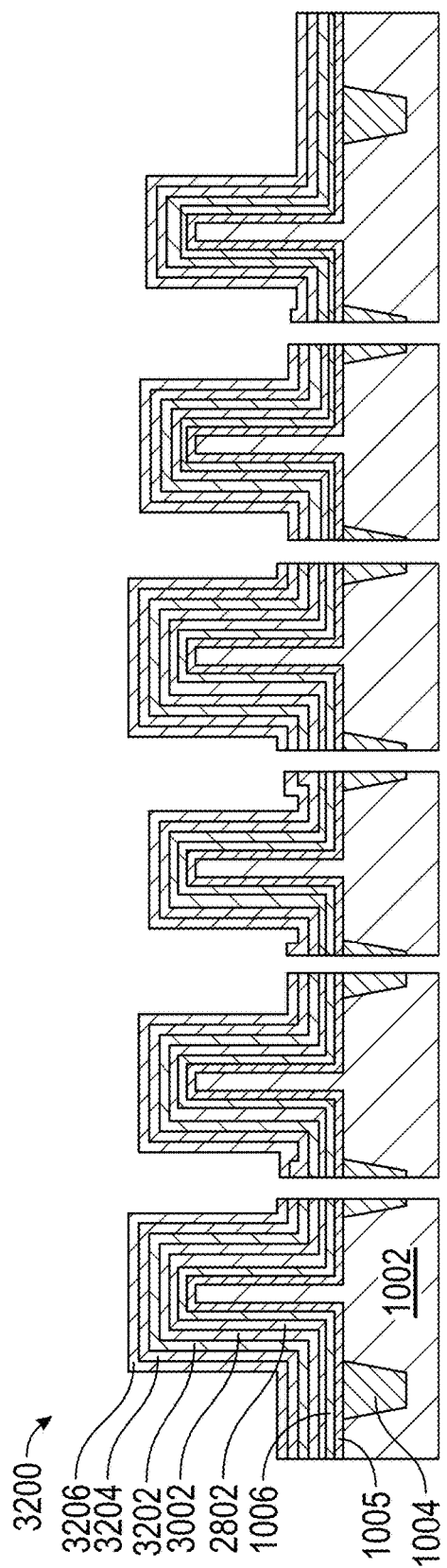
Figure 28:
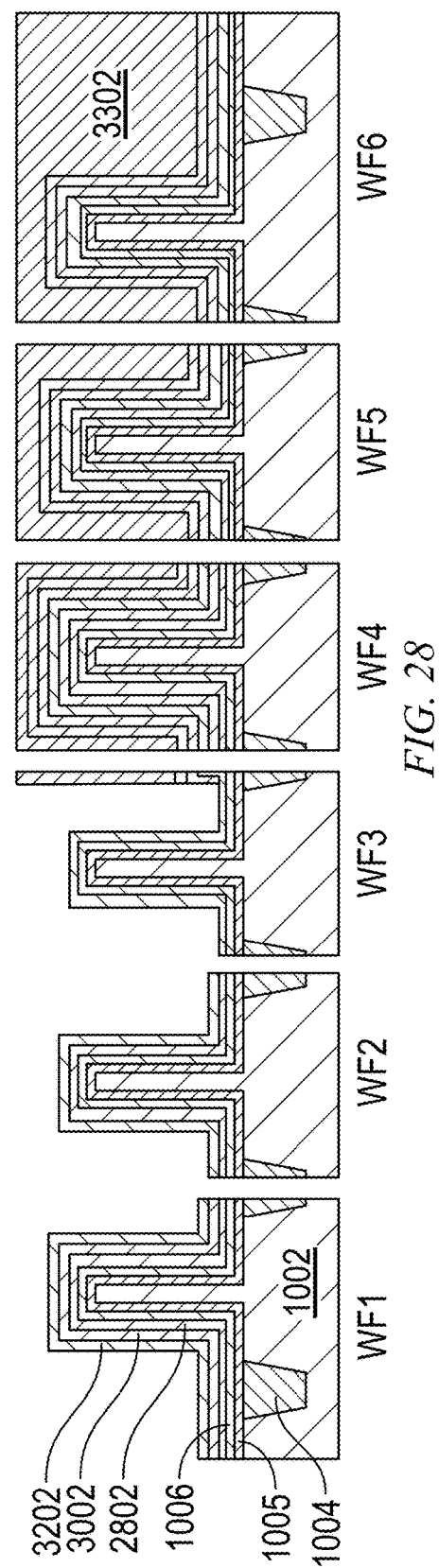

At 2710, form a fifth structure 3200 (as shown in FIG. 27) by stripping the photoresist 3102, then depositing a third barrier layer 3202, an etch stop layer (e.g., lanthanum oxide, . . . ) 3204, and a cap layer 3206 (e.g., titanium nitride). The etch stop layer is provided to prevent the chemical etching of the layer underneath. Lanthanum oxide ($La_2O_3$) is a non-limiting example; other materials can also be used, as will be apparent to the skilled artisan. At 2712, form a sixth structure 3300 (as shown in FIG. 28) by patterning a photoresist 3302 on regions 2816, 2818, 2820 and removing the cap layer 3206 and the lanthanum oxide 3204 from regions 2810, 2812, 2814 ("WF1-WF3" in FIG. 22). At 2714, form a seventh structure 3400 (as shown in FIG. 29) by stripping the photoresist 3302 and depositing a first work function metal 3402. At 2716, form an eighth structure 3500 (as shown in FIG. 30) by patterning a photoresist 3502 on regions 2810, 2812, 2814 and removing the first work function metal 3402, the cap layer 3206, and the lanthanum oxide 3204 from regions 2816, 2818, 2820 ("WF4-WF6" in FIG. 22). At 2718, form structure 1600 (as shown in FIG. 12) by stripping the photoresist 3502, then depositing second work function metal 1602, wetting layer 1604, and electrode 1606. At 2720, form structure 1700 (as shown in FIG. 2) by chemical mechanical polishing (CMP).

Given the discussion thus far, it will be appreciated that, in general terms, an exemplary semiconductor structure 1700, according to an aspect of the invention, includes a semiconductor substrate 1002, and a first field effect transistor (FET) gate 1014 formed on the substrate. The first FET gate includes an interfacial layer 1005; a high-κ dielectric layer 1006; a first barrier layer 1402; a first work function metal stack 1404 on the first barrier layer; and a second work function metal stack 1602 on the first work function metal stack.

In one or more embodiments, the structure 1700 also includes a second FET gate 1012 formed on the substrate. The second FET gate includes the first barrier layer 1402; a second barrier layer 1018 under the first barrier layer; and the second work function metal stack 1602 on the first barrier layer. In one or more embodiments, the first work function metal stack is absent from the second FET gate.

In one or more embodiments, the first and second FET gates are contiguous.

In one or more embodiments, a third FET gate is formed on the substrate. The third FET gate includes the first barrier layer 1402; a second barrier layer 1202 under the first barrier layer; a third barrier layer 1008 under the second barrier layer; and the second work function metal stack 1602 on the first barrier layer. In one or more embodiments, the first work function metal stack is absent from the third FET gate.

In one or more embodiments, a fourth FET gate 1010 is formed on the substrate. The fourth FET gate includes the first barrier layer 1402; the second barrier layer 1202 under the first barrier layer; the third barrier layer 1008 under the second barrier layer; the first work function metal 1404 on the first barrier layer; and the second work function metal 1602 layer on the first work function metal.

In one or more embodiments, the first work function metal stack and the second work function metal stack are a single layer of an identical (same) material (i.e., each layer is of the same material as the other layer). In one or more embodiments, the first work function metal stack and the second work function metal stack each are a single layer but of different material (i.e., each is a single layer but each layer is of different material than the other layer). In one or more embodiments, the first work function metal stack and the second work function metal stack each comprise multiple metal layers of identical (same) materials (i.e., each of the multiple metal layers is of the same material as the other metal layers). In one or more embodiments, the first work function metal stack and the second work function metal stack each comprise multiple metal layers of different materials (i.e., the first work function metal stack and the second work function metal stack each comprise multiple metal layers with at least one of the metal layers being of a different material than the other metal layers).

In one or more embodiments, the third FET gate and the fourth FET gate are contiguous.

According to another aspect, a semiconductor structure 1700 includes a common semiconductor substrate 1002; a first field effect transistor (FET) gate 1020 formed on the substrate, which has a first threshold voltage and comprises a first work function metal 1602 and a first barrier layer 1402; and a second FET gate 1014 formed on the substrate, which has a second threshold voltage and comprises the first work function metal, the first barrier layer, and a second work function metal 1404.

In one or more embodiments, the second work function metal of the second FET gate underlies the first work function metal of the second FET gate.

In one or more embodiments, the first FET gate does not include the second work function metal.

In one or more embodiments, a third FET gate 1012 also is formed on the substrate. The third FET gate 1018 has a third threshold voltage and comprises the first work function metal, the first barrier layer, and a second barrier layer 1202.

In one or more embodiments, the third FET gate also includes the second work function metal 1404.

Another aspect provides one or more of several methods 900, 1800, 2700 for making, on a common substrate, a plurality of field effect transistor (FET) gates that have different threshold voltages. The method includes producing a structure that comprises a plurality of regions on the common substrate, wherein each region has one or more barrier layers on the substrate and a first work function metal covering the one or more barrier layers; at 912, patterning a photoresist on less than all of the regions and etching the first work function metal from unpatterned ones of the regions; at 914, stripping the photoresist and depositing a second work function metal over a first of the regions that is covered by the first work function metal and over a second of the regions that is not covered by the first work function metal.

In one or more embodiments, producing the structure includes forming, in the substrate, shallow trench isolation (STI) that separates the structure into the plurality of regions, and, at 902, depositing a high-κ dielectric (HK) and a first barrier layer onto the substrate.

In one or more embodiments, producing the structure includes, at 904, patterning a first subgroup of the plurality of regions with photoresist and etching exposed portions of the first barrier layer from a second subgroup of the plurality of regions that are not patterned with photoresist.

In one or more embodiments, producing the structure includes, at 906, stripping the photoresist and depositing a second barrier layer.

In one or more embodiments, producing the structure includes, at 908, patterning a third subgroup of the plurality of regions with photoresist, wherein the third subgroup of the plurality of regions includes the first subgroup of the plurality of regions and fewer than all of the second subgroup of the plurality of regions; and removing exposed portions of the second barrier layer from a fourth subgroup of the plurality of regions that are not patterned with photoresist.

In one or more embodiments, producing the structure includes, at 910, stripping the photoresist and depositing a third barrier layer.

In one or more embodiments, producing the structure includes, at 910, depositing the first work function metal.

Embodiments of the invention relate to semiconductor fabrication. Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures.

A number of different precursors may be used for the epitaxial deposition of the in situ doped semiconductor material. In some embodiments, the gas source for the deposition of an epitaxially formed in situ doped semiconductor material may include silicon (Si) deposited from silane, disilane, trisilane, tetrasilane, hexachlorodisilane, tetrachlorosilane, dichlorosilane, trichlorosilane, disilane and combinations thereof. In other examples, when the in situ doped semiconductor material includes germanium, a germanium gas source may be selected from the group consisting of germane, digermane, halogermane, dichlorogermane, trichlorogermane, tetrachlorogermane and combinations thereof. Examples of other epitaxial growth processes that can be employed in growing semiconductor layers described herein include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE).

By "in-situ" it is meant that the dopant that dictates the conductivity type of doped layer is introduced during the process step, for example epitaxial deposition, that forms the doped layer. The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

As used herein, the term "conductivity type" denotes a dopant region being p-type or n-type. As further used herein, "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium. As used herein, "n-type" refers to the addition of impurities that contribute free electrons to an intrinsic semiconductor. Examples of n-type dopants, i.e., impurities in a silicon-containing substrate include but are not limited to antimony, arsenic and phosphorous.

As an exemplary subtractive process, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material(s) when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example: James D. Plummer et al., *Silicon VLSI Technology: Fundamentals, Practice, and Modeling* $1^{st}$ *Edition*, Prentice Hall, 2001 and P. H. Holloway et al., *Handbook of Compound Semiconductors: Growth, Processing, Characterization, and Devices*, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:
   a semiconductor substrate;
   a first field effect transistor (FET) gate formed on the substrate, wherein the first FET gate comprises:
      an interfacial layer;
      a high-κ dielectric layer;
      a first barrier layer contacting the high-κ dielectric layer;
      a first work function metal stack on the first barrier layer; and
      a second work function metal stack on the first work function metal stack; and
   a second FET gate formed on the substrate, wherein the second FET gate comprises:
      the first barrier layer;
      a second barrier layer under the first barrier layer; and
      the second work function metal stack on the first barrier layer.

2. The semiconductor structure of claim 1, wherein the first work function metal stack is absent from the second FET gate.

3. The semiconductor structure of claim 1, further comprising:
   a third FET gate formed on the substrate, wherein the third FET gate comprises:
      the first barrier layer;
      the second barrier layer under the first barrier layer;
      a third barrier layer under the second barrier layer; and
      the second work function metal stack on the first barrier layer.

4. The semiconductor structure of claim 3, wherein the first work function metal stack is absent from the third FET gate.

5. The semiconductor structure of claim 3, further comprising a fourth FET gate formed on the substrate, wherein the fourth FET gate comprises:
   the first barrier layer;
   the second barrier layer under the first barrier layer;
   the third barrier layer under the second barrier layer;
   the first work function metal stack on the first barrier layer; and
   the second work function metal stack on the first work function metal.

6. The semiconductor structure of claim 1, wherein the first work function metal stack and the second work function metal stack are a single layer of an identical material.

7. The semiconductor structure of claim 1, wherein the first work function metal stack and the second work function metal stack each are a single layer but of different material.

8. The semiconductor structure of claim 1, wherein the first work function metal stack and the second work function metal stack each comprise multiple metal layers of identical materials.

9. The semiconductor structure of claim 1, wherein the first work function metal stack and the second work function metal stack each comprise multiple metal layers of different materials.

10. A semiconductor structure comprising:
    a common semiconductor substrate;
    a first field effect transistor (FET) gate formed on the substrate, which has a first threshold voltage and comprises:
       a first barrier layer;
       a first n-type work function metal outward of the first barrier layer; and
       a second n-type work function metal outward of the first n-type work function metal; and
    a second FET gate formed on the substrate, which has a second threshold voltage and comprises:
       the first barrier layer,
       a second barrier layer inward of the first barrier layer; and
       the second n-type work function metal outward of the first barrier layer.

* * * * *